US 10,957,676 B2

(12) United States Patent
Kobayakawa et al.

(10) Patent No.: US 10,957,676 B2
(45) Date of Patent: Mar. 23, 2021

(54) LED PACKAGE

(71) Applicant: ROHM CO., LTD., Kyoto (JP)

(72) Inventors: Masahiko Kobayakawa, Kyoto (JP);
Riki Shimabukuro, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/072,955

(22) Filed: Mar. 17, 2016

(65) Prior Publication Data

US 2016/0284678 A1 Sep. 29, 2016

(30) Foreign Application Priority Data

Mar. 23, 2015 (JP) .............................. JP2015-059315

(51) Int. Cl.
*H01L 33/48* (2010.01)
*H01L 25/16* (2006.01)
(Continued)

(52) U.S. Cl.
CPC .......... *H01L 25/167* (2013.01); *H01L 33/486* (2013.01); *H01L 29/866* (2013.01);
(Continued)

(58) Field of Classification Search
CPC ... H01L 25/167; H01L 33/486; H01L 33/507; H01L 33/56; H01L 33/62
See application file for complete search history.

(56) References Cited

U.S. PATENT DOCUMENTS 4,843,280 A * 6/1989 Lumbard .................. G09F 9/33
257/E25.02
6,345,903 B1 * 2/2002 Koike ................... H01L 33/486
257/E33.059
(Continued)

FOREIGN PATENT DOCUMENTS

JP 2001-144333 5/2001
JP 2001144333 A * 5/2001
(Continued)

OTHER PUBLICATIONS

Japanese Office Action, issued in the corresponding Japanese patent application No. 2015-059315, dated Dec. 25, 2018, 11 pages.
(Continued)

*Primary Examiner* — Cuong Q Nguyen
*Assistant Examiner* — Peter M Albrecht
(74) *Attorney, Agent, or Firm* — Hamre, Schumann, Mueller & Larson, P.C.

(57) ABSTRACT

A light emitting device (LED) package includes: a substrate having a loading surface, a mounting surface and a pair of concave portions formed at both ends of the substrate, wherein each of the concave portions has an inner surface intersecting both of the loading surface and the mounting surface; metal wirings including a pair of electrodes, which covers a portion of the loading surface and the mounting surface and the inner surface, and a conductive part disposed on the loading surface; an LED chip loaded on the conductive part; a housing having a side wall surrounding the LED chip and a supporting surface facing the loading surface; and a covering member which is disposed on the loading surface and has a closing portion overlapping at least a portion of the concave portions when viewed from above, wherein at least a portion of the supporting surface is fixed to the closing portion.

47 Claims, 14 Drawing Sheets

(51) Int. Cl.
  *H01L 29/866* (2006.01)
  *H01L 33/62* (2010.01)
(52) U.S. Cl.
  CPC .... *H01L 33/62* (2013.01); *H01L 2224/48091* (2013.01); *H01L 2224/73265* (2013.01); *H01L 2224/97* (2013.01); *H01L 2924/181* (2013.01); *H01L 2933/0033* (2013.01); *H01L 2933/0066* (2013.01)

(56) References Cited

U.S. PATENT DOCUMENTS

| | | | | |
|---|---|---|---|---|
| 6,355,946 | B1* | 3/2002 | Ishinaga | H01L 33/486 257/100 |
| 6,383,835 | B1* | 5/2002 | Hata | H01L 24/97 257/433 |
| 6,495,861 | B1* | 12/2002 | Ishinaga | G09F 9/33 257/99 |
| 7,759,691 | B2* | 7/2010 | Chang | H01L 33/54 257/100 |
| 2004/0201987 | A1* | 10/2004 | Omata | H01L 33/486 362/230 |
| 2005/0151142 | A1* | 7/2005 | Imai | H01L 24/97 257/81 |
| 2008/0203416 | A1* | 8/2008 | Konishi | H01L 33/60 257/98 |
| 2011/0241030 | A1* | 10/2011 | Kim | H01L 33/60 257/88 |
| 2012/0205710 | A1* | 8/2012 | Kobayakawa | H01L 33/486 257/99 |
| 2012/0273820 | A1* | 11/2012 | Lin | H01L 33/486 257/98 |
| 2012/0299036 | A1* | 11/2012 | Liu | H01L 33/56 257/98 |
| 2012/0313122 | A1 | 12/2012 | Nakayama et al. | |
| 2015/0084080 | A1* | 3/2015 | Kawakita | H01L 25/167 257/98 |

FOREIGN PATENT DOCUMENTS

| | | |
|---|---|---|
| JP | 2002-124703 | 4/2002 |
| JP | 2006-128701 | 5/2006 |
| JP | 2008-041923 | 2/2008 |
| JP | 2012-009631 | 1/2012 |
| JP | 2012-094679 | 5/2012 |
| JP | 2012-212824 | 11/2012 |
| JP | 2013-021259 | 1/2013 |
| JP | 2014-013879 | 1/2014 |
| JP | 2015-008237 | 1/2015 |
| WO | 2011/104963 | 9/2011 |

OTHER PUBLICATIONS

Japanese Office Action, issued in the corresponding Japanese patent application No. 2015-059315, dated Jul. 2, 2019, 8 pages.

* cited by examiner

LED PACKAGE

CROSS-REFERENCE TO RELATED APPLICATION(S)

This application is based upon and claims the benefit of priority from Japanese Patent Application No. 2015-59315, filed on Mar. 23, 2015, the entire contents of which are incorporated herein by reference.

TECHNICAL FIELD

The present disclosure relates to a light emitting device (LED) package for use in backlights of a variety of lighting devices and liquid crystal displays, and the like.

BACKGROUND

An LED package for use in backlights of a variety of lighting devices and liquid crystal displays, and the like requires high brightness. As one example of LED packages with high brightness, there has been conventionally proposed an LED package in which an LED chip is mounted on a substrate on which metal wirings are formed, and a housing enclosing the LED chip is fixed to the substrate. The housing acts as a reflector for reflecting light emitted from the LED chip. Since the reflector for reflecting the light acts as a secondary light source, the inclusion of the housing helps to increase the brightness of the LED package.

A plurality of concave portions is formed in the substrate of the LED package. The concave portions are portions required to form electrodes of the LED package. When the housing is fixed to the substrate, in order to secure an adhesion area of the housing to the substrate to obtain a sufficient adhesive force, the housing is fixed to a position avoiding the concave portions when viewed from above. In this case, a distance between the LED chip and an inner peripheral surface of the housing facing the LED chip may be reduced and a range of the secondary light source of the LED package formed by the housing may be accordingly reduced. Therefore, it is difficult to sufficiently meet the demands for high brightness in an LED package in which a plurality of concave portions is formed in a substrate.

SUMMARY

The present disclosure provides some embodiments of an LED package which is capable of increasing brightness while securing an adhesion force between a substrate and a housing.

According to one embodiment of the present disclosure, there is provided an LED package including: a substrate having a loading surface, a mounting surface and a pair of concave portions formed at both ends of the substrate, wherein the loading surface and the mounting surface face opposite directions and each of the pair of concave portions has an inner surface intersecting both the loading surface and the mounting surface; metal wirings including a pair of electrodes, which covers a portion of the loading surface and the mounting surface of the substrate and the inner surface of the concave portions, and a conductive part disposed on the loading surface; an LED chip loaded on the conductive part of the metal wirings; a housing having a side wall surrounding the LED chip and a supporting surface facing the loading surface of the substrate; and a covering member which is disposed on the loading surface of the substrate and has a closing portion overlapping at least a portion of the concave portions when viewed from above, wherein at least a portion of the supporting surface of the housing is fixed to the closing portion.

In some embodiments, the covering member is formed with an opening portion containing the LED chip when viewed from above.

In some embodiments, the LED package further includes an adhesive layer interposed between the covering member and the supporting surface of the housing.

In some embodiments, the covering member is made of material which allows both of an adhesion strength between the metal wirings and the covering member and an adhesion strength between the housing and the covering member to be larger than an adhesion strength between the metal wirings and the housing.

In some embodiments, the covering member is a film made of synthetic film.

In some embodiments, the covering member is white.

In some embodiments, a portion of the metal wirings is covered with the covering member.

In some embodiments, the metal wirings have a portion interposed between the loading surface of the substrate and the supporting surface of the housing.

In some embodiments, the conductive part of the metal wirings includes a first conductive part and a second conductive part which are spaced from each other, the first conductive part being in electrical conduction with one of the electrodes, and the second conductive part being in electrical conduction with the other of the electrodes.

In some embodiments, the first conductive part includes a die pad on which the LED chip is loaded.

In some embodiments, the second conductive part includes a wire bonding pad and the LED package further includes a bonding wire electrically interconnecting the LED chip and the wire bonding pad.

In some embodiments, the LED package further includes a junction layer interposed between the LED chip and the die pad of the first conductive part.

In some embodiments, the junction layer is an electrical conductor.

In some embodiments, the junction layer is an electrical insulator.

In some embodiments, the side wall of the housing has an inner peripheral surface facing the LED chip and an area of a shape formed by the inner peripheral surface when viewed from above becomes larger as it gets farther away from the substrate in a thickness direction of the substrate.

In some embodiments, an outer edge shape formed by the inner peripheral surface of the housing when viewed from above is rectangular.

In some embodiments, an outer edge shape formed by the inner peripheral surface of the housing when viewed from above is circular.

In some embodiments, the LED package further includes a sealing resin which covers the LED chip and is filled in a region surrounded by the side wall of the housing.

In some embodiments, the sealing resin is formed of transparent synthetic resin containing fluorescent substances.

In some embodiments, each of the electrodes includes an Au plating layer.

In some embodiments, the LED package further includes an insulating film which is an electrical insulator formed on the mounting surface of the substrate and is located in a region sandwiched between the pair of electrodes on the mounting surface.

In some embodiments, the LED package further includes a protection element loaded on the conductive part of the metal wirings.

In some embodiments, the conductive part of the metal wirings includes a die pad on which the LED chip is loaded, and an additional die pad on which the protection element is loaded.

In some embodiments, the protection element is a Zener diode.

The above and other features and advantages of the present disclosure will be more clearly apparent from the following detailed description in conjunction with the accompanying drawings.

DETAILED DESCRIPTION

Embodiments of a light receiving device according to the present disclosure will now be described in detail with reference to the drawings.

First Embodiment

Figure 1:
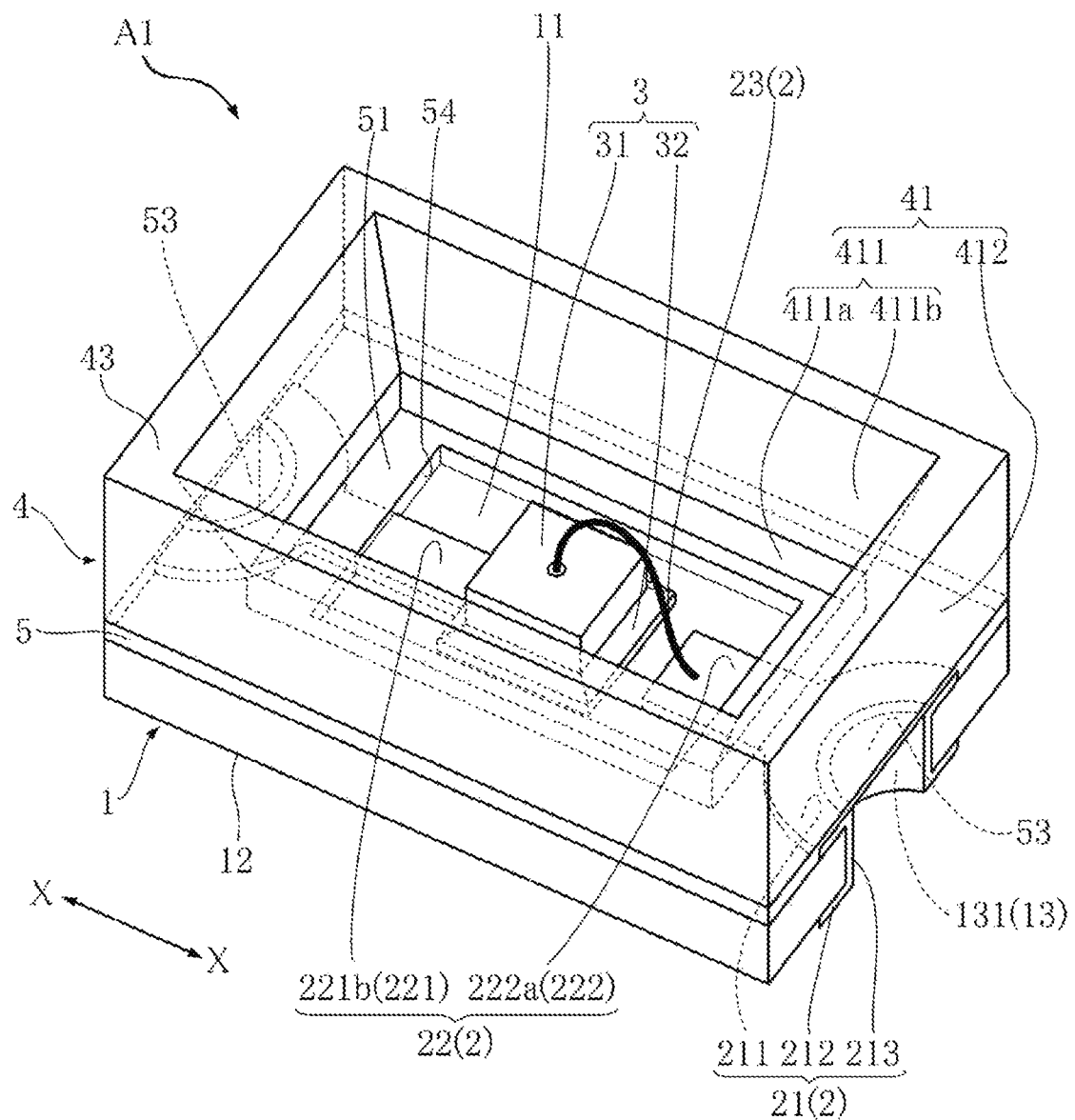
FIG. 1 is a main part perspective view showing an LED package according to a first embodiment of the present disclosure.
Figure 2:
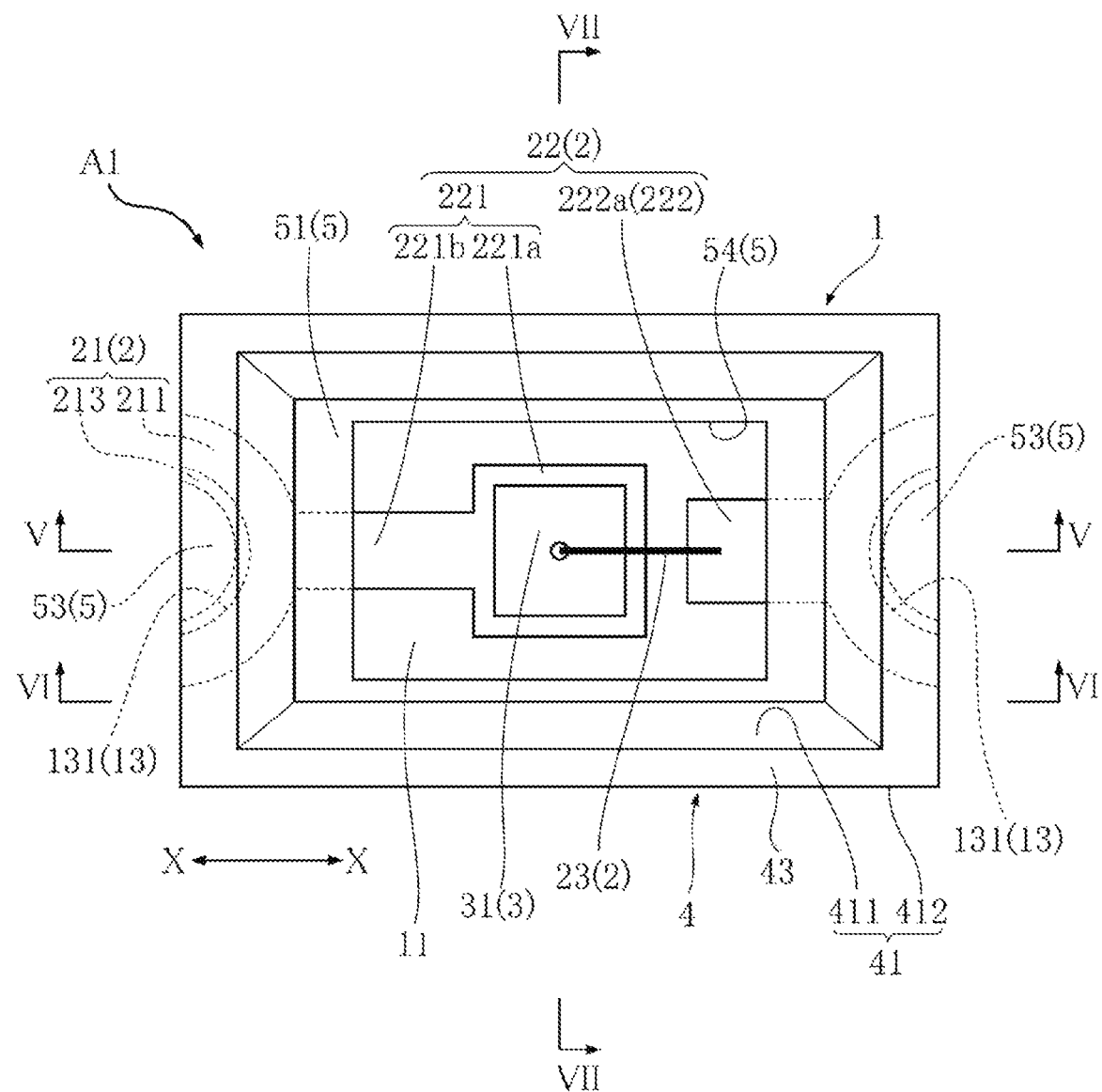
FIG. 2 is a main part plan view showing the LED package of FIG. 1.
Figure 3:
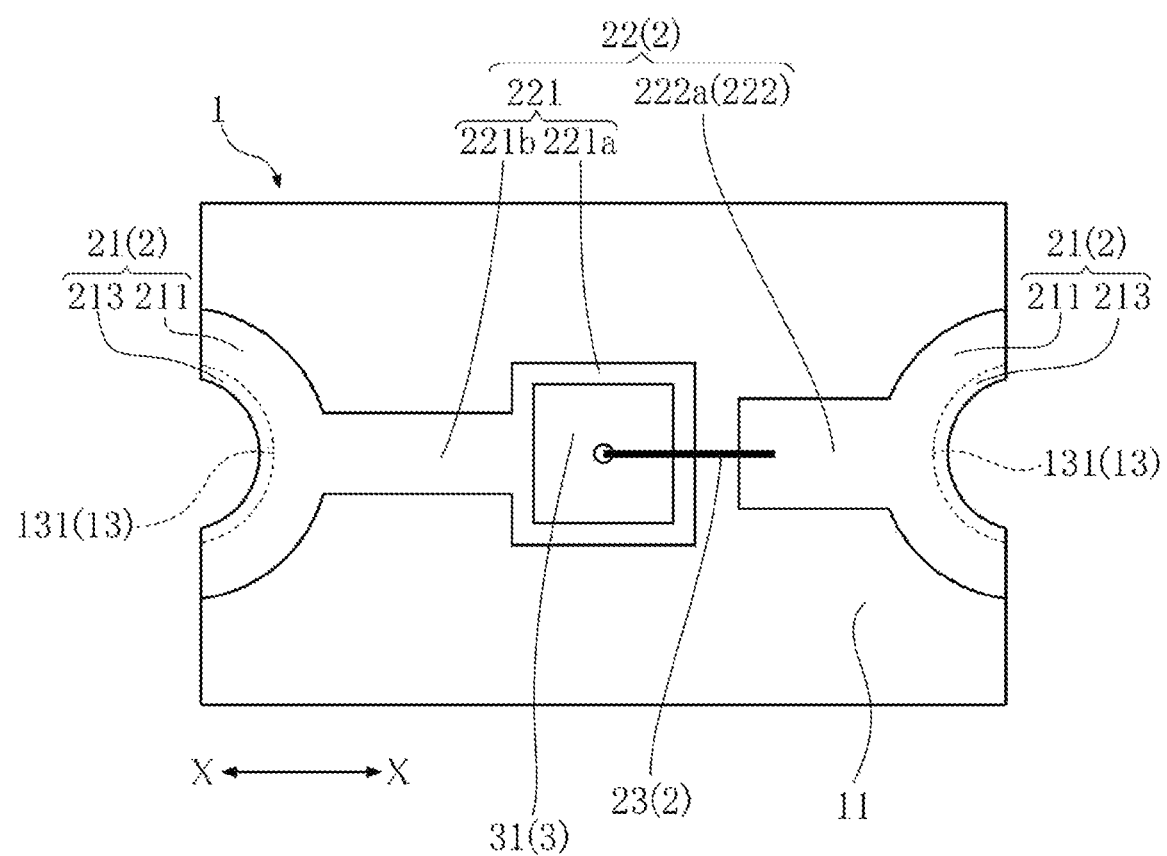
FIG. 3 is a main part plan view in which a housing, a covering material and a sealing resin are not shown.
Figure 4:
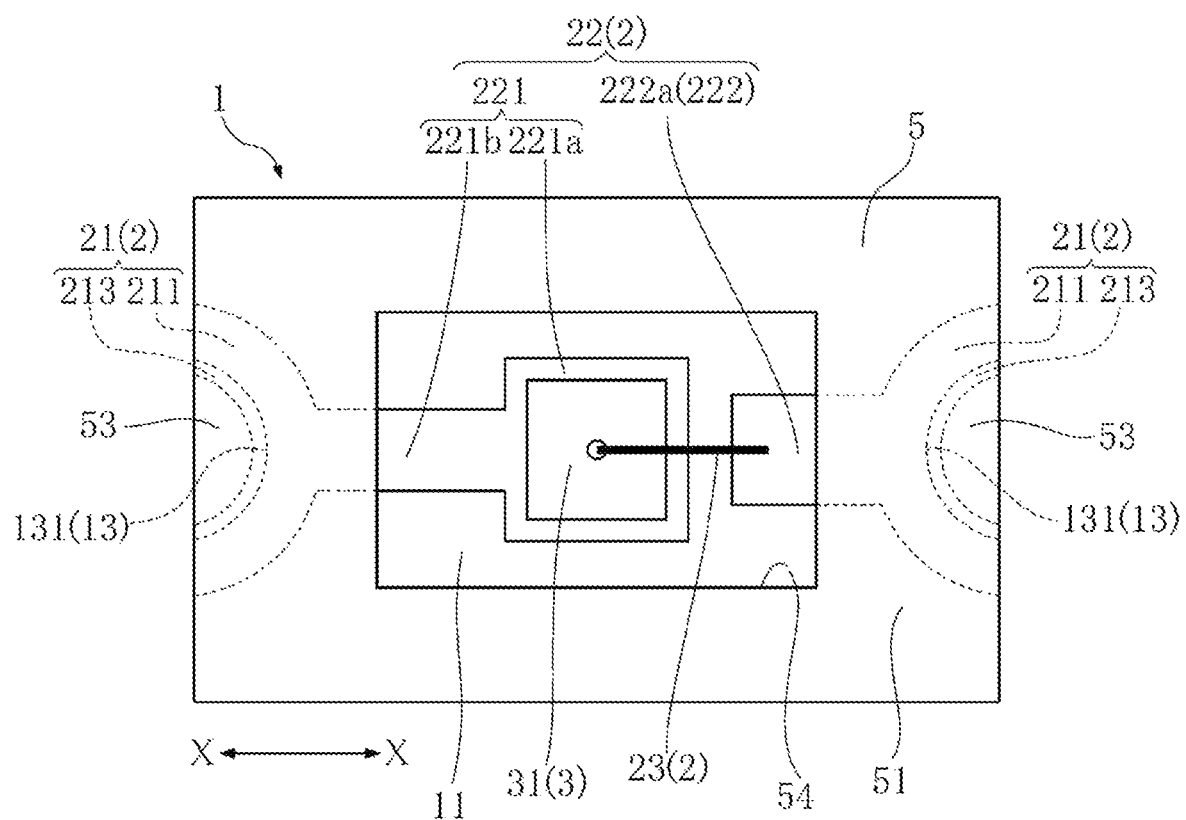
FIG. 4 is a main part plan view in which a housing and a sealing resin are not shown.
Figure 5:
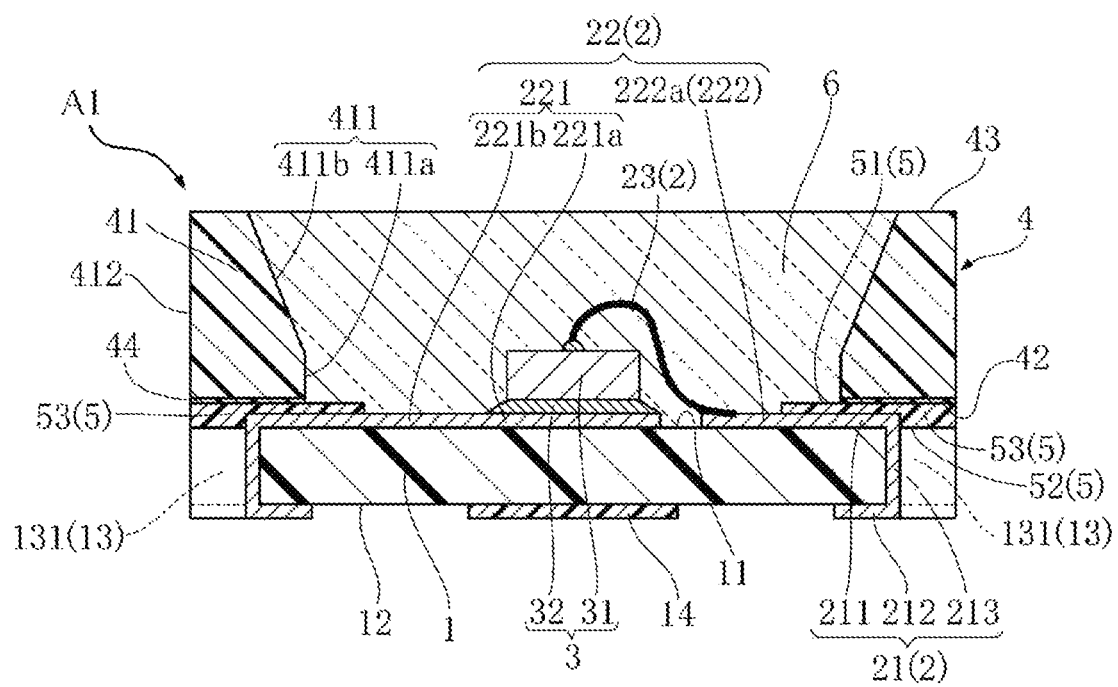
FIG. 5 is a sectional view taken along line V-V in FIG. 2.
Figure 6:
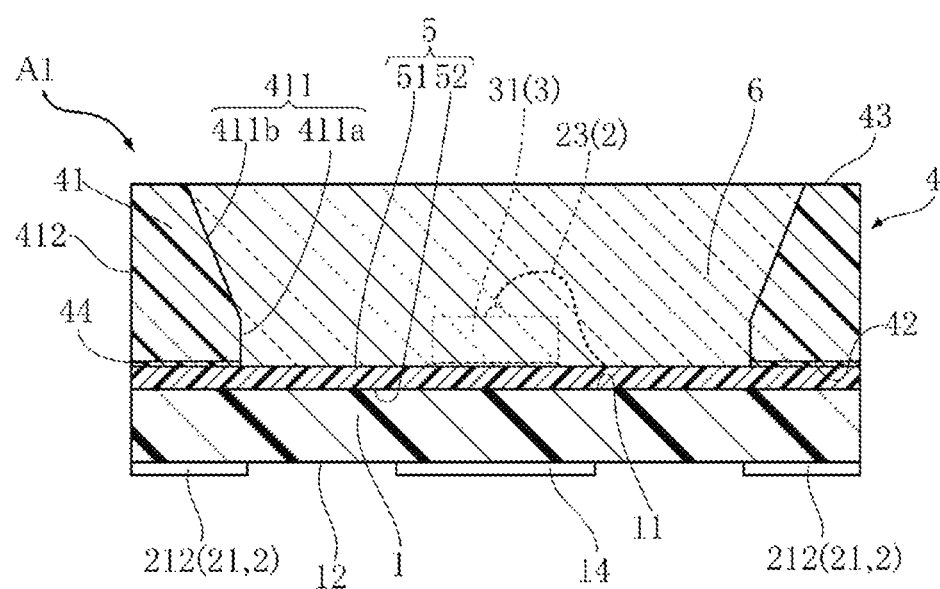
FIG. 6 is a sectional view taken along line VI-VI in FIG. 2.
Figure 7:
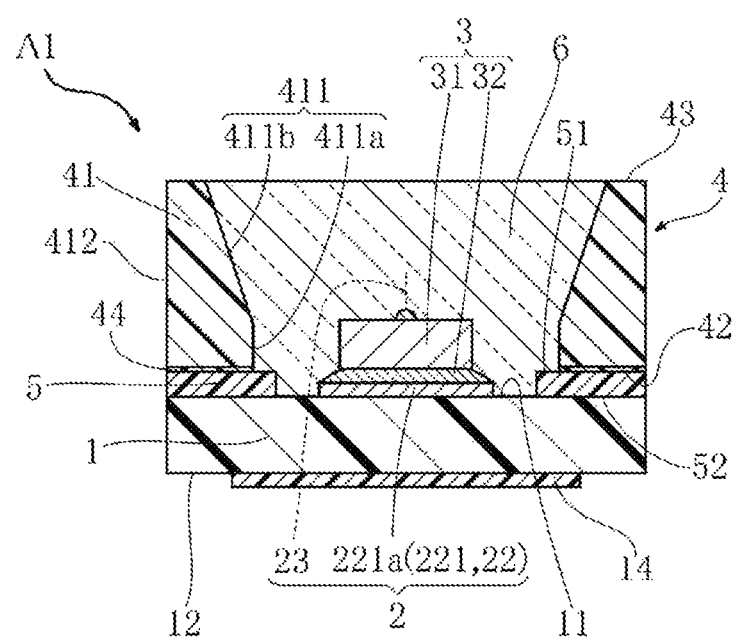
FIG. 7 is a sectional view taken along line VII-VII in FIG. 2.
Figure 8:
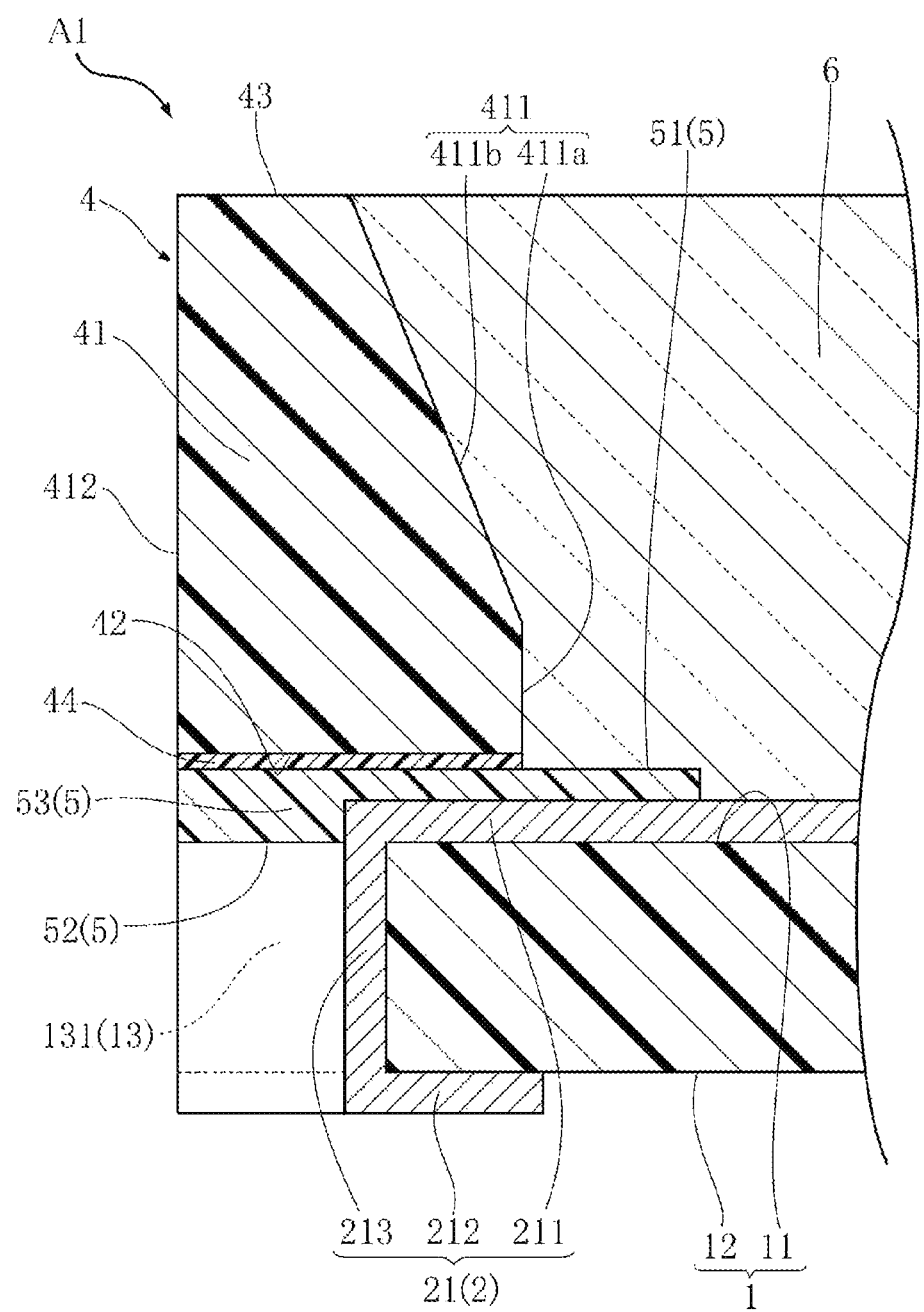
FIG. 8 is a partially enlarged sectional view showing a portion of FIG. 5.

An LED package A1 according to a first embodiment of the present disclosure will be described below with reference to FIGS. 1 to 8. FIG. 1 is a main part perspective view showing an LED package A1. FIG. 2 is a main part plan view showing the LED package A1. FIG. 3 is a main part plan view in which a housing 4, a covering member 5 and a sealing resin 6, which will be described later, are excluded from FIG. 2. FIG. 4 is a main part plan view in which the housing 4 and the sealing resin 6, which will be described later, are excluded from FIG. 2. FIG. 5 is a sectional view taken along line V-V in FIG. 2. FIG. 6 is a sectional view taken along line VI-VI in FIG. 2. FIG. 7 is a sectional view taken along line VII-VII in FIG. 2. FIG. 8 is a partially enlarged sectional view showing a portion of FIG. 5. In addition, for the purpose of easy understandings, FIGS. 1 and 2 do not show the sealing resin 6 to be described later. In addition, for the purpose of easy understanding, FIGS. 2, 3 and 4 do not show a junction layer 32 of an LED chip 3 to be described later.

The LED package A1 shown in FIGS. 1 to 8 is of a type to be surface-mounted on a module such as a backlight of a variety of lighting devices and liquid crystal displays. The LED package A1 of this embodiment includes a substrate 1, metal wirings 2, an LED chip 3, the housing 4, the covering member 5 and the sealing resin 6. In this embodiment, the LED package A1 has a rectangular shape when viewed from above.

The substrate 1 is loaded with the LED chip 3 and is used to mount the LED package A1 on the module. The substrate 1 is an electrical insulator. The substrate 1 is made of, for example, glass epoxy resin or ceramics such as alumina ($Al_2O_3$) or the like. For easy dissipation of heat generated from the LED chip 3 to the outside when the LED package A1 is used, it is desirable that the substrate 1 has a relatively high thermal conductivity. In this embodiment, the substrate 1 has a rectangular shape with long sides in the direction X when viewed from above, as shown in FIG. 3. The substrate 1 has a loading surface 11, a mounting surface 12, concave portions 13 and an insulating film 14.

The loading surface 11 corresponds to the upper surface of the substrate 1 shown in FIG. 5 and is a surface on which the LED chip 3 is loaded. The mounting surface 12 corresponds to the lower surface of the substrate 1 shown in FIG. 5 and is a surface used to mount the LED package A1 on the module. The loading surface 11 and the mounting surface 12 face opposite directions.

The concave portions 13 are formed in pair at both ends of the substrate 1 in the direction X shown in FIG. 3. The concave portions 13 have a shape recessed into the substrate 1 in the direction X when viewed from above. In addition, the concave portions 13 have a uniform shape in the thickness direction of the substrate 1. In this embodiment, the outer edges of the concave portions 13 have an arc shape when viewed from above. The concave portions 13 also have respective inner surfaces 131. The inner surfaces 131 are surfaces that form substantially the semi-cylindrical shape in the thickness direction of the substrate 1. The inner surfaces 131 intersect both of the loading surface 11 and the mounting surface 12.

The insulating film 14 is formed on the mounting surface 12. The insulating film 14 is located in a region sandwiched between a pair of electrodes 21 of metal wirings 2, which will be described later, in the mounting surface 12. The insulating film 14 is an electrical insulator, which is called "solder resist." The LED package A1 is mounted on the module by means of solder bonding. If a solder is adhered to the mounting surface 12, there is a possibility that the pair of electrodes 21 in the mounting surface 12 makes mutual electrical conduction due to the solder, which may result in short-circuit of the LED package A1. Therefore, the insulating film 14 serves to prevent a solder from being adhered to the mounting surface 12 and prevent the LED package A1 from being short-circuited.

The metal wirings 2 include the pair of electrodes 21, a conductive part 22 and a bonding wire 23. All of the metal wirings 2 have conductivity.

The pair of electrodes 21 is a pair of members which are spaced from each other and are in electrical conduction with the LED chip 3. The pair of electrodes 21 is used to interconnect the LED package A1 and a wiring pattern of the module. In this embodiment, the pair of electrodes 21 is arranged at both sides with the LED chip 3 sandwiched therebetween in the direction X shown in FIG. 3. Each of the pair of electrodes 21 includes an upper surface electrode 211, a rear surface electrode 212 and a side surface electrode 213. The pair of electrodes 21 is formed of plating layers. In this embodiment, for example, a Cu plating layer, an Ni plating layer and an Au plating layer are laminated in this order from the front surface of the substrate 1 toward the outside.

The upper surface electrode 211 is a portion disposed at an end portion on the loading surface 11 of the substrate 1. The upper surface electrode 211 covers a portion of the loading surface 11. In this embodiment, when viewed from above, the shape of the upper surface electrode 211 is a stripped shape forming an arc, as shown in FIG. 3. However, the upper surface electrode 211 may have a planar shape other than that shown in FIG. 3. The upper surface electrode 211 is connected to a portion of the conductive part 22.

The rear surface electrode 212 is a portion disposed at an end portion on the mounting surface 12 of the substrate 1. The rear surface electrode 212 covers a portion of the mounting surface 12. The rear surface electrode 212 has substantially the same planar shape (not shown) as the upper surface electrode 211. Like the upper surface electrode 211, the rear surface electrode 212 may have a planar shape other than that described above. The rear surface electrode 212 is in electrical conduction with the wiring pattern of the module by means of soldering bonding.

The side surface electrode 213 is a portion disposed in the corresponding concave portion 13 of the substrate 1. The side surface electrode 213 covers the inner surface 131 of the concave portion 13 and is connected to the upper surface electrode 211 and the rear surface electrode 212. Therefore, the upper surface electrode 211 and the rear surface electrode 212 are in mutual electrical conduction by the side surface electrode 213. In this embodiment, the side surface electrode 213 has a substantially semi-cylindrical shape in the thickness direction of the substrate 1.

The conductive part 22 is a portion disposed on the loading surface 11 of the substrate 1. The conductive part 22 is connected to the pair of electrodes 21. In this embodiment, the LED chip 3 is mounted on the conductive part 22. Like the pair of electrodes 21, the conductive part 22 is formed of a plurality of laminated plating layers. The conductive part 22 consists of a first conductive part 221 and a second conductive part 222.

The first conductive part 221 and the second conductive part 222 are spaced from each other. The first conductive part 221 is in electrical conduction with one electrode 21 (the left electrode 21 shown in FIG. 3) and the second conductive part 222 is in electrical conduction with the other electrode 21 (the right electrode 21 shown in FIG. 3).

The first conductive part 221 includes a die pad 221a and a strip portion 221b. The die pad 221a is a rectangular portion, when viewed from above, on which the LED chip 3 is loaded. As shown in FIG. 3, the die pad 221a is located in the center of the substrate 1 when viewed from above. In this embodiment, the die pad 221a is in electrical conduction with a chip body 31 of the LED chip 3, which will be described later. The strip portion 221b interconnects the die pad 221a and the upper surface electrode 211 of the one electrode 21 and, when viewed from above, is a strip portion extending in the direction X shown in FIG. 3. The one electrode 21 is in electrical conduction with the chip body 31 of the LED chip 3 through the strip portion 221b.

The second conductive part 222 includes a wire bonding pad 222a. The wire bonding pad 222a is connected to the upper surface electrode 211 of the other electrode 21 and is a strip-shaped portion extending in the direction X shown in FIG. 3.

The bonding wire 23 is a wire interconnecting the chip body 31 of the LED chip 3, which will be described later, and the wire bonding pad 222a of the second conductive part 222. The other electrode 21 is in electrical conduction with the chip body 31 of the LED chip 3 through the bonding wire 23. The bonding wire 23 is made of, for example, Au.

The LED chip 3 serves as a light source of the LED package A1. The LED chip 3 includes the chip body 31 and the junction layer 32. The chip body 31 is, for example, an element consisting of a plurality of semiconductor layers laminated by a pn junction. When a current is flown into the LED package A1, the chip body 31 emits light. Blue light, red light and green light are emitted from materials constituting the semiconductor layers. In this embodiment, a p side electrode (anode) (not shown) is formed on the upper surface of the chip body 31 shown in FIG. 5 and an n side electrode (cathode) (not shown) is formed on the lower surface of the chip body 31 shown in FIG. 5. When the bonding wire 23 of the metal wirings 2 is connected to the p side electrode, the chip body 31 makes electrical conduction with the wire bonding pad 222a of the second conductive part 222 through the bonding wire 23. In addition, the n side electrode makes electrical conduction with the die pad 221a of the first conductive part 221 through the junction layer 32.

The junction layer 32 is a portion interposed between the chip body 31 and the die pad 221a of the first conductive part 221. The junction layer 32 serves to fix the chip body 31 to the die pad 221a. In this embodiment, the junction layer 32 is an electrical conductor. In this case, the junction layer 32 is made of, for example, Ag paste.

The housing 4 is a member which is fixed to the loading surface 11 of the substrate 1 and surrounds the LED chip 3. In this embodiment, the housing 4 has a frame shape when viewed from above. The housing 4 has a side wall 41, a supporting surface 42, a top surface 43 and an adhesive layer 44. The housing 4 is an electrical insulator. In this embodiment, the housing 4 is made of, for example, white epoxy resin. The housing 4 acts as a reflector for reflecting light emitted from the chip body 31 of the LED chip 3. Since the reflector for reflecting the light acts as a secondary light source, the inclusion of the housing 4 helps to increase the brightness of the LED package A1.

The side wall 41 is a portion having a frame shape, when viewed from above, surrounding the LED chip 3. The side wall 41 is disposed along the outer edge of the substrate 1. The side wall 41 has an inner peripheral surface 411 and an outer peripheral surface 412. The inner peripheral surface 411 is a surface facing the LED chip 3. In this embodiment, an outer edge formed by the inner peripheral surface 411 has a rectangular shape when viewed from above. The inner peripheral surface 411 acts as the reflector for reflecting the light emitted from the chip body 31 of the LED chip 3. The inner peripheral surface 411 has an erection portion 411a and an inclination portion 411b. The erection portion 411a is a portion of the inner peripheral surface 411, which erects from the loading surface 11 of the substrate 1, and is perpendicular to the supporting surface 42. When viewed from above, the area of the shape formed by the erection portion 411a is uniform in the thickness direction of the substrate 1. The inclination portion 411b is a portion of the inner peripheral surface 411, which is inclined to the loading surface 11, and intersects the top surface 43. When viewed from above, the area of the shape formed by the inclination portion 411b becomes larger as it becomes farther away from the substrate 1 in the thickness direction of the substrate 1. The outer peripheral surface 412 is a surface facing the outside of the LED package A1. Therefore, the inner peripheral surface 411 and the outer peripheral surface 412 face opposite directions. The outer peripheral surface 412 is built up from the loading surface 11 of the substrate 1. The outer peripheral surface 412 is perpendicular to both of the supporting surface 42 and the top surface 43.

The supporting surface 42 corresponds to the lower surface of the housing 4 shown in FIG. 5 and is a surface used to dispose the housing 4 on the loading surface 11 of the substrate 1. The supporting surface 42 is perpendicular to both the erection portion 411a of the inner peripheral surface 411 and the outer peripheral surface 412. The supporting surface 42 faces the loading surface 11. As shown in FIG. 5, among the metal wirings 2, the upper surface electrode 211 of the pair of electrodes 21 and a portion of the side surface electrode 213 thereof are interposed between the loading surface 11 and the supporting surface 42.

The top surface 43 corresponds to the upper surface of the housing 4 shown in FIG. 5 and is a surface facing the same direction as the loading surface 11 of the substrate 1. Therefore, the supporting surface 42 and the top surface 43 face opposite directions. The top surface 43 intersects the inclination portion 411b of the inner peripheral surface 411 and is perpendicular to the outer peripheral surface 412. The top surface 43 is higher than the upper surface of the chip body 31 of the LED chip 3 shown in FIG. 5. In this embodiment, the top surface 43 has a frame shape when viewed from above.

The adhesive layer 44 is a portion interposed between the supporting surface 42 and the covering member 5 to be described later. The adhesive layer 44 serves to fix the housing 4 to the loading surface 11 of the substrate 1. In this embodiment, the adhesive layer 44 is made of, for example, UV-curable acryl resin or epoxy resin.

The covering member 5 is a member disposed on the loading surface 11 of the substrate 1. The covering member 5 has a front surface 51, a rear surface 52, a closing portion 53 and an opening portion 54. In this embodiment, the covering member 5 is made of material to allow both an adhesion strength between the metal wirings 2 and the covering member 5, and an adhesion strength between the housing 4 and the covering member 5 to be larger than an adhesion strength between the metal wirings 2 and the housing 4. In this embodiment, the covering member 5 is a film made of white synthetic resin. An example of the covering member 5 may include a white solder resist film. In addition, as shown in FIG. 4, among the metal wirings 2, a portion of the upper surface electrode 211 of the pair of electrodes 21, a portion of the side surface electrode 213 of the pair of electrodes 21, a portion of the strip portion 221b of the conductive part 22 and a portion of the wire bonding pad 222a are covered by the covering member 5.

The front surface 51 corresponds to the upper surface of the covering member 5 shown in FIG. 6 and is a surface facing the same direction as the loading surface 11 of the substrate 1. The adhesive layer 44 of the housing 4 is interposed between the front surface 51 and the supporting surface 42 of the housing 4. In this embodiment, the front surface 51 faces the entire region of the supporting surface 42. The rear surface 52 corresponds to the lower surface of the covering member 5 shown in FIG. 6 and is a surface used to dispose the covering member 5 on the loading surface 11. Therefore, the front surface 51 and the rear surface 52 face opposite directions.

The closing portion 53 is a portion overlapping at least a portion of the concave portion 13 of the substrate 1 when viewed from above. That is, the closing portion 53 is a portion covering the concave portion 13 in the loading surface 11 of the substrate 1. In this embodiment, as shown in FIG. 4, the closing portion 53 overlaps the entire region of the concave portion 13 when viewed from above. A portion of the supporting surface 42 of the housing 4 is fixed to the closing portion 53 through the adhesive layer 44 of the housing 4. In addition, as shown in FIGS. 2 and 8, in this embodiment, the entire region of the closing portion 53 is covered with the supporting surface 42.

The opening portion 54 is a portion containing the LED chip 3 when viewed from above. As shown in FIG. 4, portions of the substrate 1, the metal wirings 2 and the LED chip 3, which overlap the opening portion 54 when viewed from above, are not covered by the covering member 5. In this embodiment, the opening portion 54 has a rectangular shape. The opening portion 54 allows the LED chip 3, the bonding wire 23 of the metal wirings 2, a portion of the loading surface 11 of the substrate 1 and a portion of the conductive part 22 of the metal wirings 2 not to be covered with the covering member 5.

The sealing resin 6 is a member which covers the LED chip 3 and is filled in a region surrounded by the side wall 41 of the housing 4. The portions of the substrate 1 and metal wirings 2 and the LED chip 3, which are not covered with the covering member 5 due to the opening portion 54 of the covering member 5, are all covered with the sealing resin 6. The sealing resin 6 is in contact with the entire region of the inner peripheral surface 411 of the side wall 41 of the housing 4. In addition, the upper surface of the sealing resin 6 shown in FIG. 5 is flush with the top surface 43 of the housing 4. In this embodiment, the sealing resin 6 is made of, for example, synthetic resin consisting mainly of epoxy resin and is transparent to light. In this embodiment, the sealing resin 6 has a rectangular shape when viewed from above.

Fluorescent substances (not shown) may be contained in the sealing resin 6. For example, if the chip body 31 of the LED chip 3 emits blue light, white light is emitted from the LED package A1 by using the sealing resin 6 containing yellow fluorescent substances. If the chip body 31 emits a purple near-ultraviolet ray, white light with higher color rendering properties is emitted from the LED package A1 by using the sealing resin 6 containing three-color fluorescent substances of red, blue and green.

Figure 9:
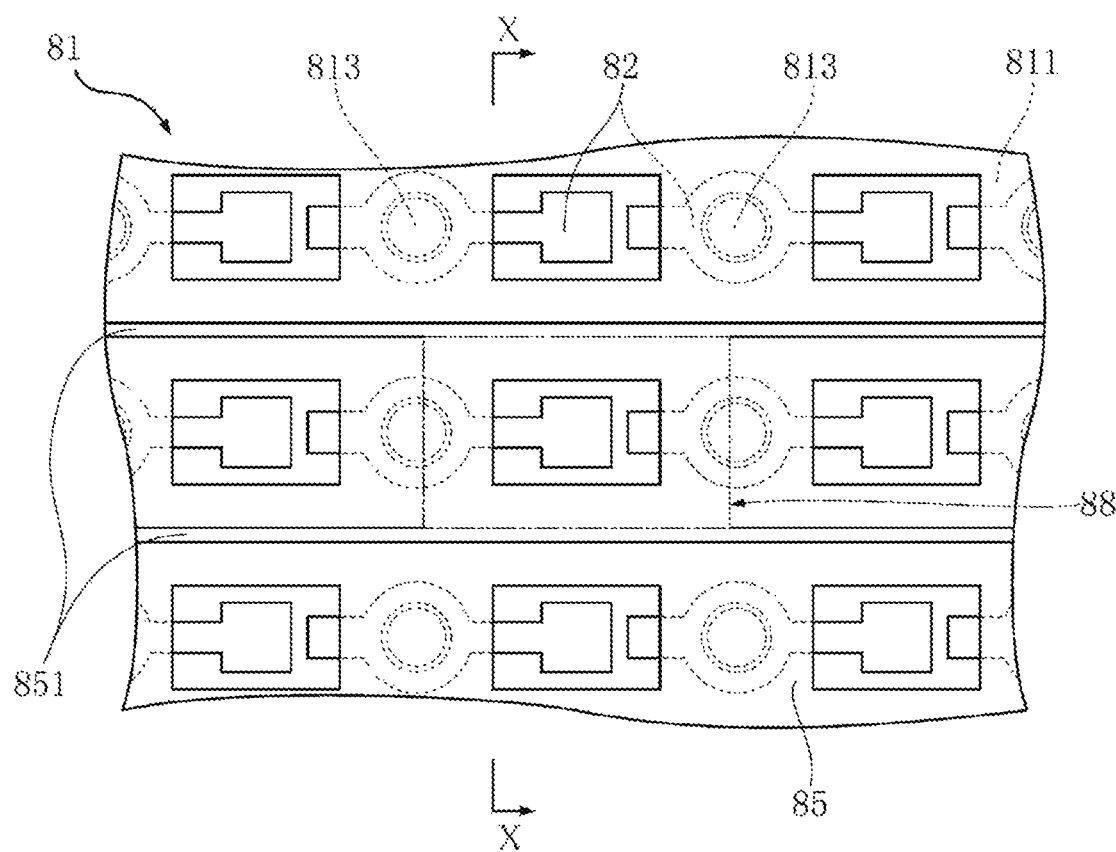
FIG. 9 is a main part plan view showing a process in a method for manufacturing the LED package of FIG. 1.
Figure 10:
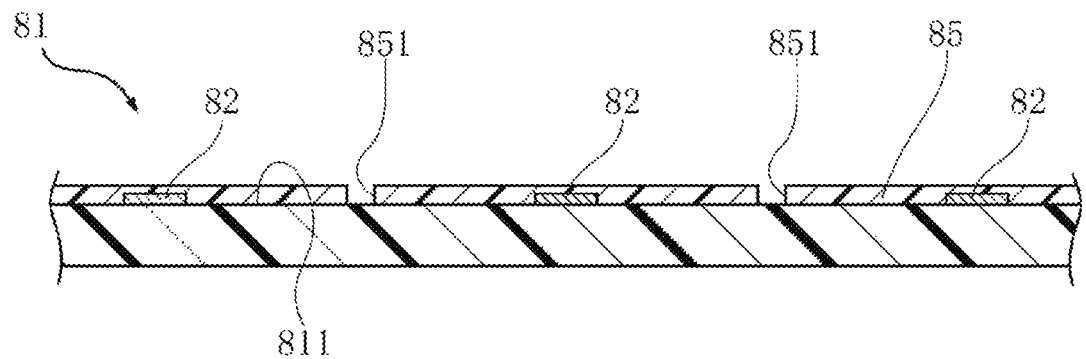
FIG. 10 is a partially enlarged sectional view taken along line X-X in FIG. 9.

Next, a portion of a method for manufacturing the LED package A1 will be described with reference to FIGS. 9 and 10. FIG. 9 is a main part plan view showing a process in a method for manufacturing the LED package A1. FIG. 10 is a partially enlarged sectional view taken along line X-X in FIG. 9.

FIG. 9 shows a state in which a plurality of metal wiring bodies 82 is arranged on a loading surface 811 of a sheet-like substrate 81 and a covering sheet 85 is pasted on the loading surface 811. The sheet-like substrate 81 is a set of a plurality of substrates 1. Each of the plurality of metal wiring bodies 82 corresponds to the metal wirings 2. As shown in FIG. 9, a region 88 surrounded by a two-dot chain line in the sheet-like substrate 81 serves as the LED package A1. The sheet-like substrate 81 is formed with a plurality of through-holes 813 penetrating through the sheet-like substrate 81. Each through-hole 813 is a portion serving as the concave portion 13 of the substrate 1. In this embodiment, the covering sheet 85 is formed with a plurality of grooves 851 in the horizontal direction shown in FIG. 9.

As shown in FIG. 10, the plurality of grooves 851 penetrates through the covering sheet 85. The covering sheet 85 is pasted on the sheet-like substrate 81 by means of heating and vacuum bonding. In this case, in a process of retuning the sheet-like substrate 81 to room temperature, a tensile force caused by shrinkage strain occurring in the covering sheet 85 acts on the loading surface 811 of the sheet-like substrate 81. The tensile force produces a warp in the sheet-like substrate 81 such that a surface located on the opposite side of the loading surface 811 is swollen. By forming the plurality of grooves 851 in the covering sheet 85, the tensile force decreases since the contact area between the sheet-like substrate 81 and the covering sheet 85 decreases. Therefore, the plurality of grooves 851 can minimize or eliminate warping of the sheet-like substrate 81.

After the state shown in FIG. 9, LED chips 3 are loaded (not shown) on the sheet-like substrate 81, and bonding wires 23 and housing 4 are disposed (not shown) on the sheet-like substrate 81. Next, regions surrounded by the housings 4 are filled (not shown) with sealing resin 6. After the sealing resin 6 is cured, the sheet-like substrate 81 is segmented into each region 88 by means of a dicing saw or the like (not shown), thereby manufacturing the LED package A1.

Next, the operation and effects of the LED package A1 will be described.

According to this embodiment, the LED package A1 is disposed on the loading surface 11 of the substrate 1 and includes the covering member 5, which has the closing portion 53 overlapping at least a portion of the concave portion 13 of the substrate 1 when viewed from above. In addition, at least a portion of the supporting surface 42 of the housing 4 is fixed to the closing portion 53. With this configuration, the closing portion 53 can be effectively utilized as an adhesion surface of the housing 4 to the substrate 1. As a result, it is possible to secure a longer distance from the center of the LED chip 3 to the inner peripheral surface 411 of the housing 4 while securing the adhesion area of the housing 4 to the substrate 1. Securing the longer distance facilitates increased expansion in the range of the secondary light source of the LED package A1, which is formed by the housing 4. As a result, it is possible to achieve higher brightness of the LED package A1 while securing an adhesion force between the substrate 1 and the housing 4.

Since the entire region of the supporting surface 42 of the housing 4 faces the front surface 51 of the covering member 5, the entire adhesive layer 44 can be directly sandwiched between the supporting surface 42 and the front surface 51. Here, the covering member 5 is made of material to allow both the adhesion strength between the metal wirings 2 and the covering member 5 and the adhesion strength between the housing 4 and the covering member 5 to be larger than the adhesion strength between the metal wirings 2 and the housing 4. Therefore, it is possible to reduce the adhesion area of the housing 4 to the substrate 1 while securing an adhesion force between the substrate 1 and the housing 4. Therefore, since the area of the loading surface 11 surrounded by the inner peripheral surface 411 of the housing 4 can be expanded, it is possible to extend a range of the secondary light source and achieve higher brightness of the LED package A1.

Since the covering member 5 is a film made of white synthetic resin, light emitted from the chip body 31 of the LED chip 3 is reflected by the covering member 5 as well as the inner peripheral surface 411 of the housing 4. Therefore, since the area of the secondary light source is extended, it is possible to achieve even higher brightness of the LED package A1.

The formation of the closing portion 53 provides a configuration in which the upper side of the concave portion 13 of the substrate 1, which is aligned with the loading surface 11 of the substrate 1, is blocked. Such a configuration can prevent the synthetic resin of the adhesive layer 44 for fixing the housing 4 to the substrate 1 from being leaked to the mounting surface 12 of the substrate 1 via the concave portion 13.

FIGS. 11 to 18 show other embodiments of the present disclosure. In these figures, the same or similar elements as the earlier-described LED package A1 are denoted by the same reference numerals and an explanation of which will not be repeated.

Modification of First Embodiment

Figure 11:
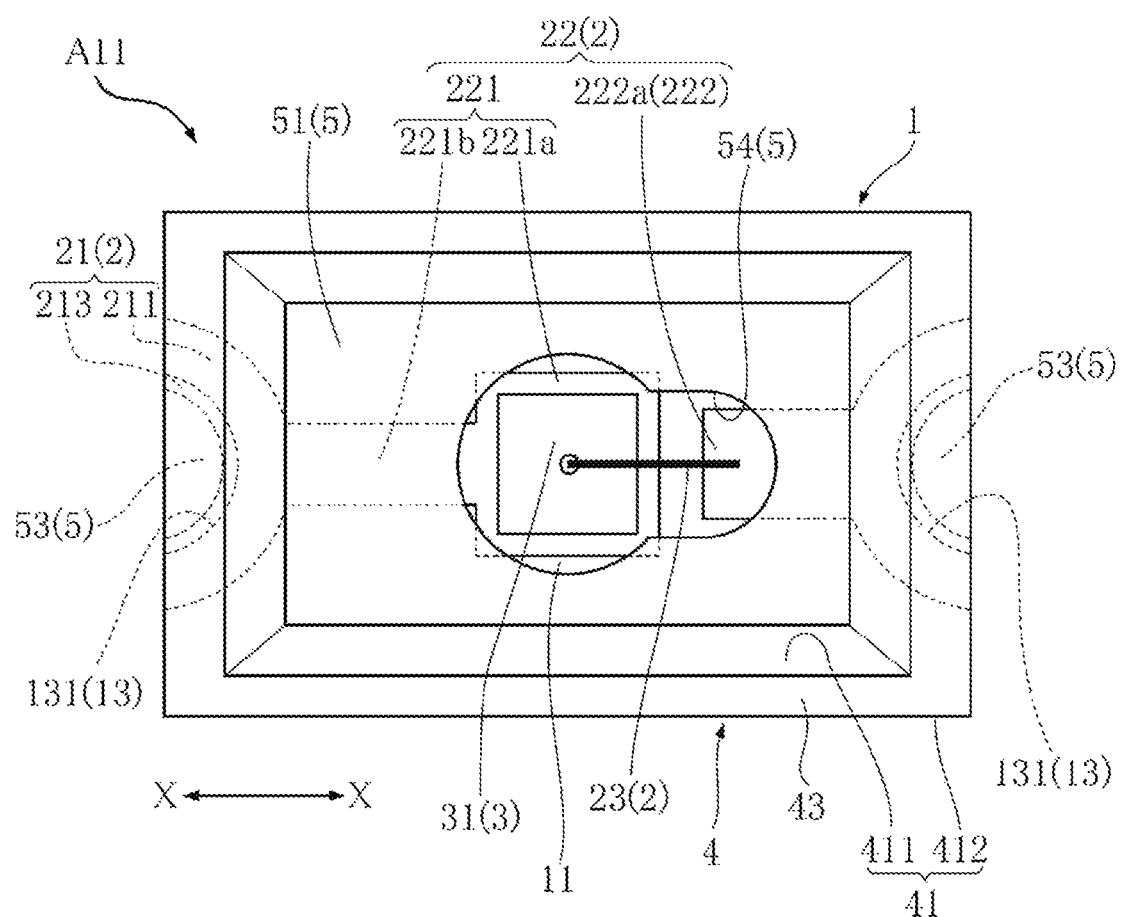
FIG. 11 is a main part plan view showing an LED package according to a modification of the first embodiment of the present disclosure.

An LED package A11 according to a modification of the first embodiment of the present disclosure will be described with reference to FIG. 11. FIG. 11 is a main part plan view showing the LED package A11. For the purpose of easy understandings, FIG. 11 does not show the junction layer 32 of the LED chip 3 and the sealing resin 6.

The LED package A11 of this embodiment is different from the earlier-described LED package A1 in terms of the form and area of the opening portion 54 of the covering member 5. As shown in FIG. 11, the opening portion 54 is in a form including a circular shape containing the LED chip 3, a semi-circular shape containing a portion of the wire bonding pad 222a of the metal wirings 2, and a rectangular shape sandwiched between the circular shape and the semi-circular shape, the circular shape, the semi-circular shape and the rectangular shape overlapping with each other. The area of the opening portion 54 is smaller than that of the LED package A1.

According to this modification, it is possible to secure a longer distance from the center of the LED chip 3 to the inner peripheral surface 411 of the housing 4 while securing the adhesion area of the housing 4 to the substrate 1. Therefore, it is possible to achieve higher brightness of the LED package A11 while securing an adhesion force between the substrate 1 and the housing 4. In addition, since the adhesion area of the covering member 5 to the substrate 1 is larger than that in the LED package A1, a reinforcing effect of the substrate 1 by the covering member 5 increases.

Second Embodiment

Figure 12:
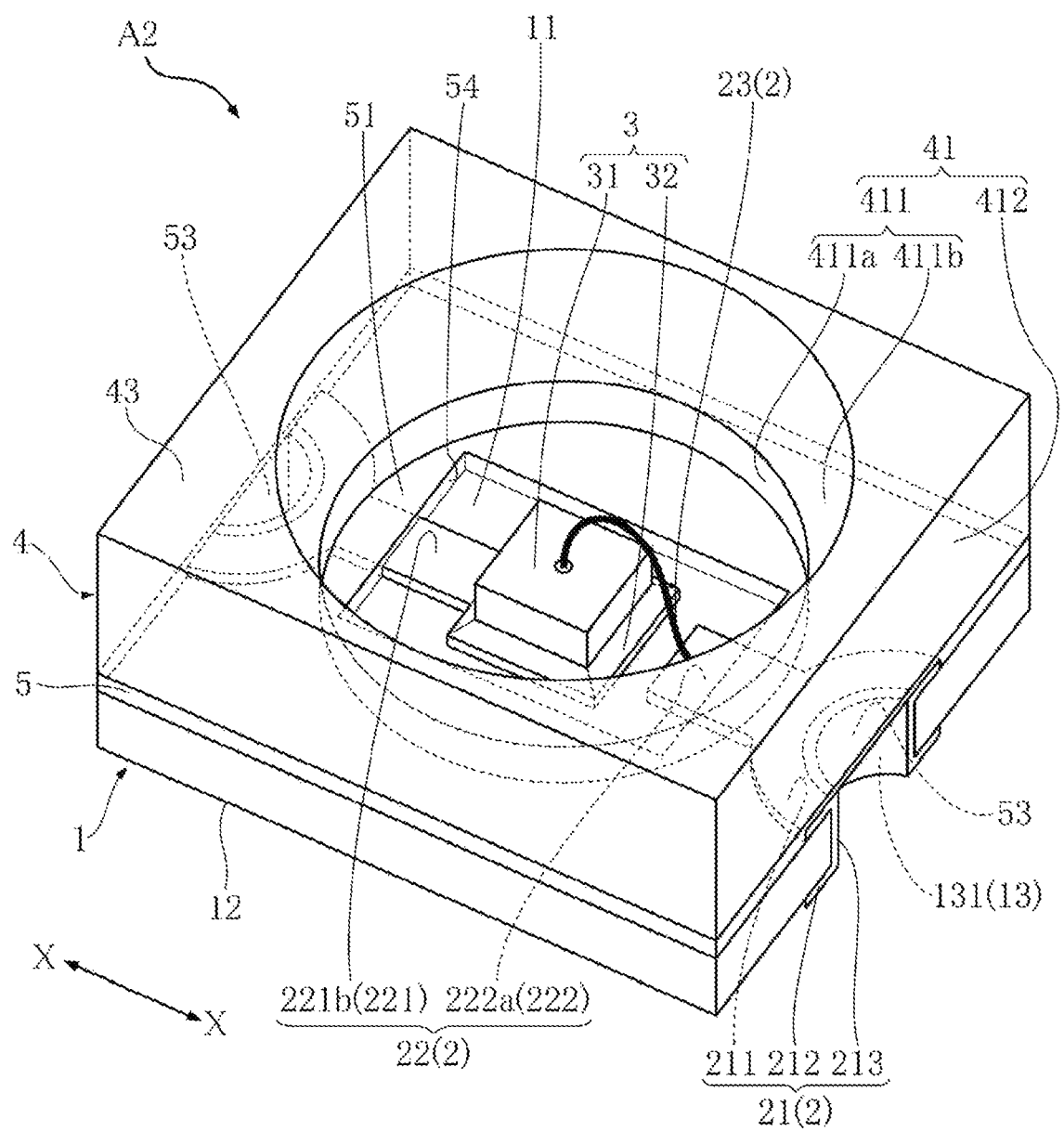
FIG. 12 is a main part perspective view showing an LED package according to a second embodiment of the present disclosure.
Figure 13:
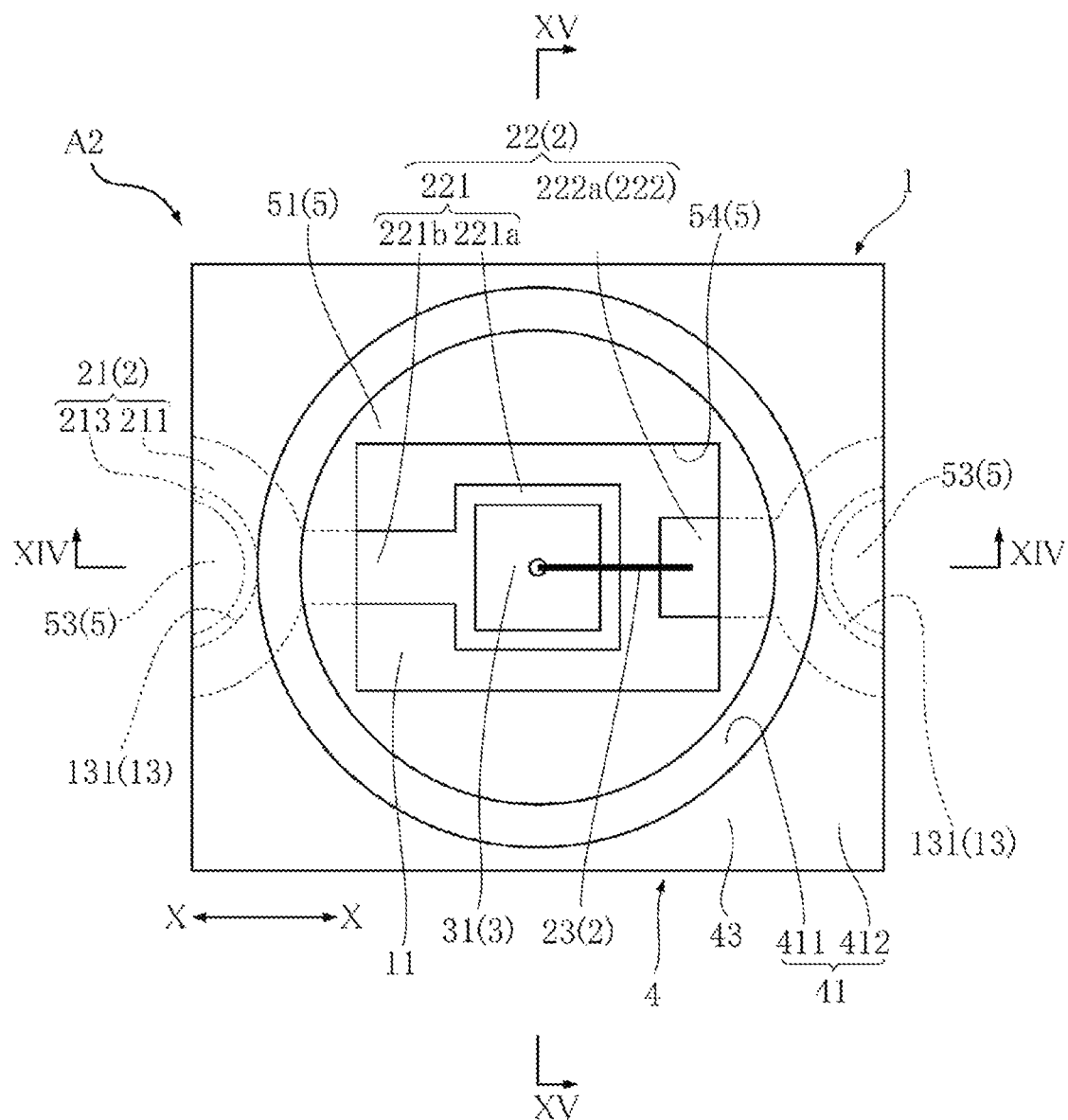
FIG. 13 is a main part plan view showing the LED package of FIG. 12.
Figure 14:
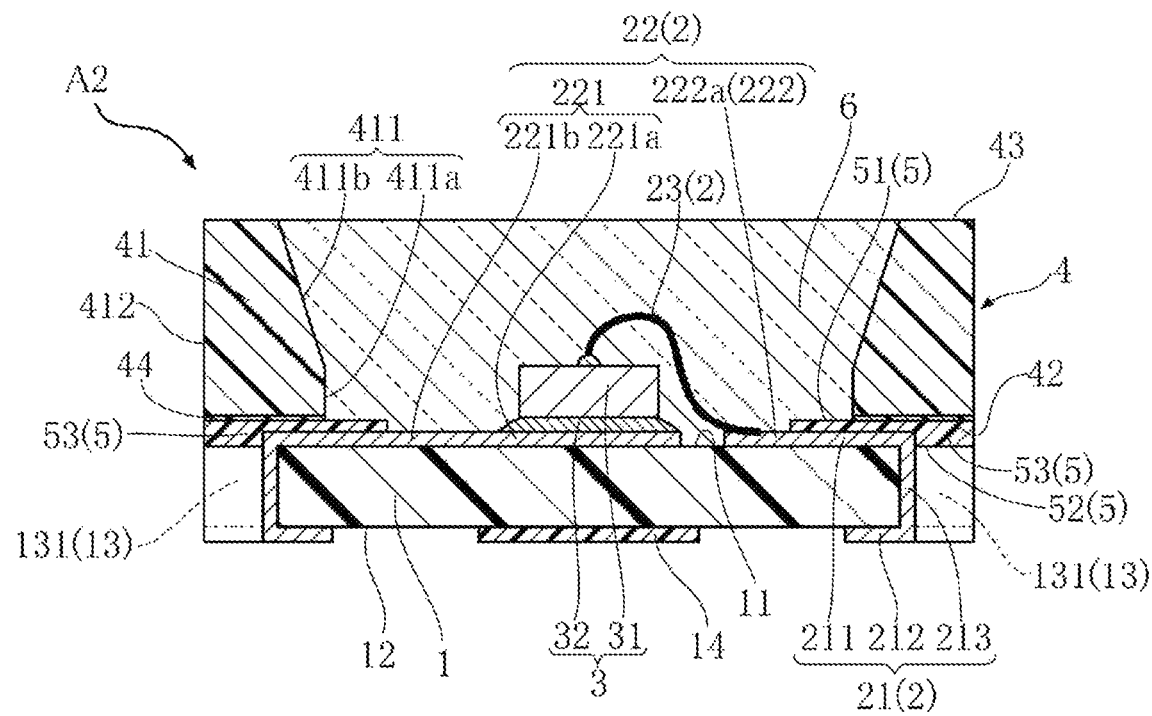
FIG. 14 is a sectional view taken along line XIV-XIV in FIG. 13.
Figure 15:
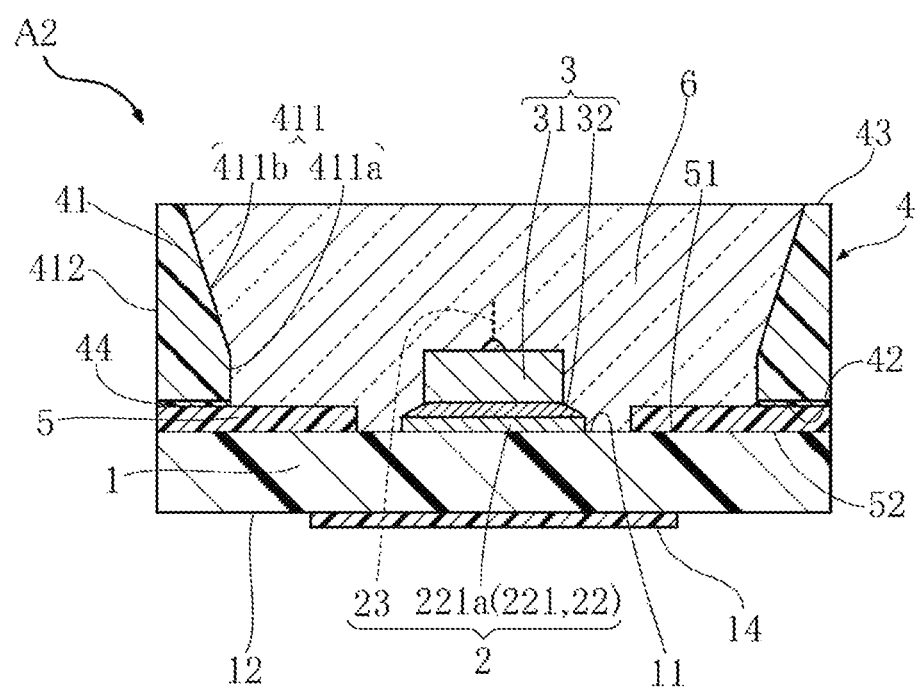
FIG. 15 is a sectional view taken along line XV-XV in FIG. 13.

An LED package A2 according to a second embodiment of the present disclosure will be described with reference to FIGS. 12 to 15. FIG. 12 is a main part perspective view showing the LED package A2. FIG. 13 is a main part plan view showing the LED package A2. FIG. 14 is a sectional view taken along line XIV-XIV in FIG. 13. FIG. 15 is a sectional view taken along line XV-XV in FIG. 13. In addition, for the purpose of easy understanding, FIGS. 12 and 13 do not show the sealing resin 6. In addition, for the purpose of easy understanding, FIG. 13 does not show the junction layer 32 of the LED chip 3. In this embodiment, the LED package A2 has a rectangular shape when viewed from above.

The LED package A2 of this embodiment is different from the earlier-described LED package A1 in terms of the planar dimensions of the substrate 1 and the covering member 5 and the planar shapes of the housing 4 and the sealing resin 6. As shown in FIG. 13, the planar dimensions of the substrate 1 and the covering member 5 are larger than those of the LED package A1. The side wall 41 of the housing 4 surrounds the LED chip 3 such that its shape becomes circular when viewed from above. Therefore, in this embodiment, when viewed from above, the outer edge shape formed by the inner peripheral surface 411 of the housing 4 is circular. The erection portion 411a and the inclination portion 411b forming the inner peripheral surface 411 are both continuous in the same plane. Therefore, the erection portion 411a has a cylindrical shape and the inclination portion 411b has a truncated conical shape. The sectional area of the truncated conical shape becomes larger as it gets farther away from the substrate 1 in the thickness direction of the substrate 1. In addition, in this embodiment, the shape of the sealing resin 6 is circular when viewed from above.

According to this embodiment, it is possible to secure a longer distance from the center of the LED chip 3 to the inner peripheral surface 411 of the housing 4 while securing the adhesion area of the housing 4 to the substrate 1. Therefore, it is possible to achieve higher brightness of the LED package A2 while securing an adhesion force between the substrate 1 and the housing 4. In addition, since the shape formed by the inner peripheral surface 411 is circular when viewed from above, the distance from the center of the LED chip 3 to the inner peripheral surface 411 of the housing 4 is constant over the entire circumference of the inner peripheral surface 411. Therefore, since the inner peripheral surface 411 serving as the secondary light source of the LED package A2 is extended uniformly around the LED chip 3, it is possible to achieve uniform brightness of the LED package A2.

Third Embodiment

Figure 16:
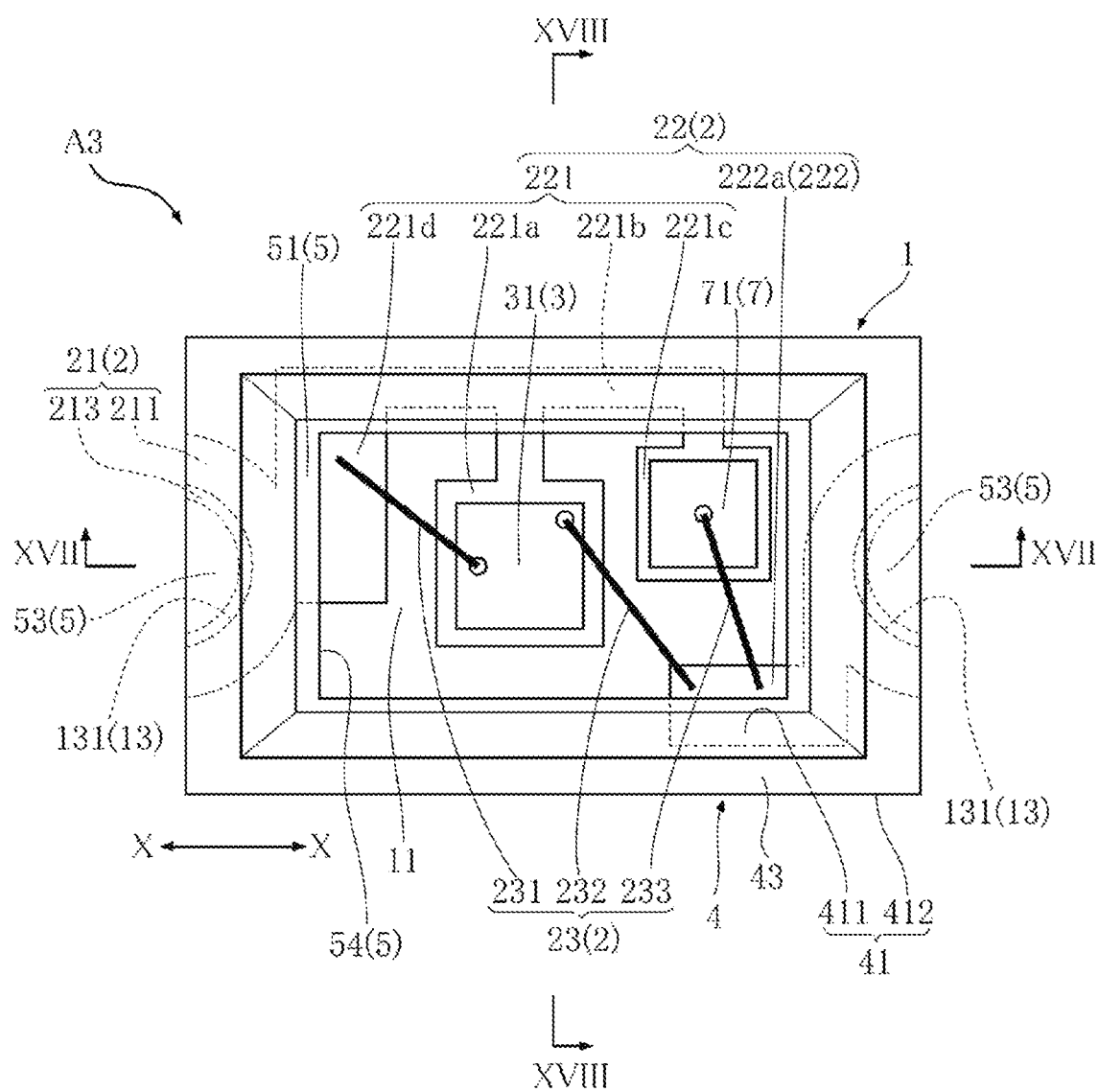
FIG. 16 is a main part plan view showing an LED package according to a third embodiment of the present disclosure.
Figure 17:
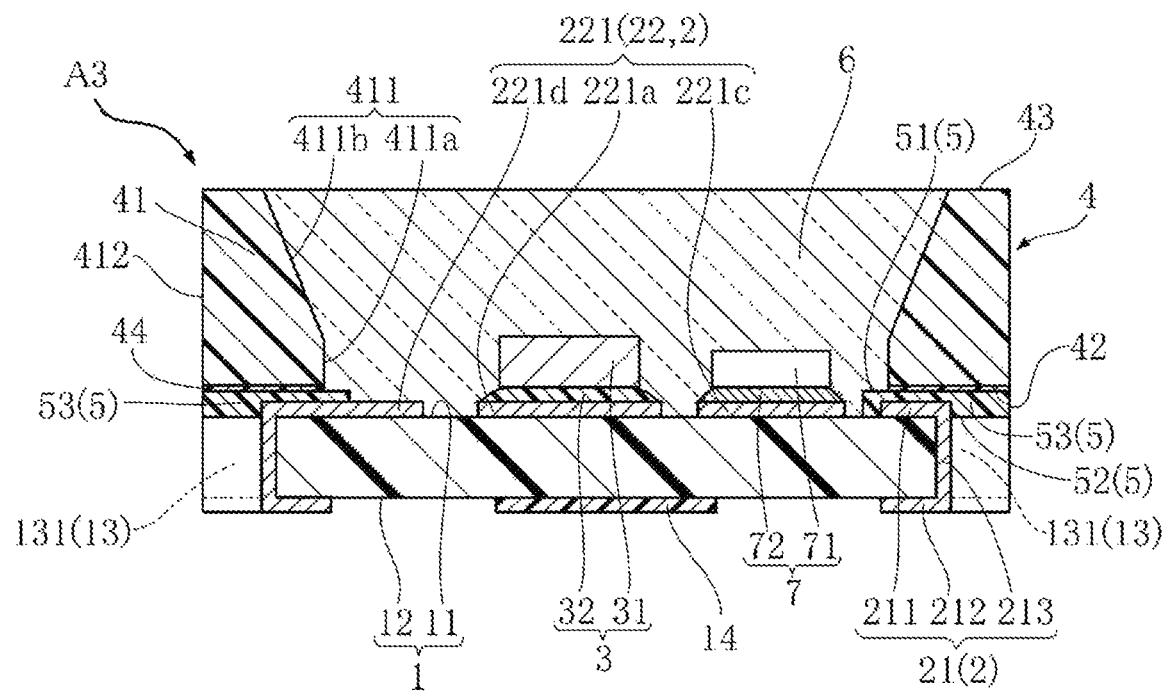
FIG. 17 is a sectional view taken along line XVII-XVII in FIG. 16.
Figure 18:
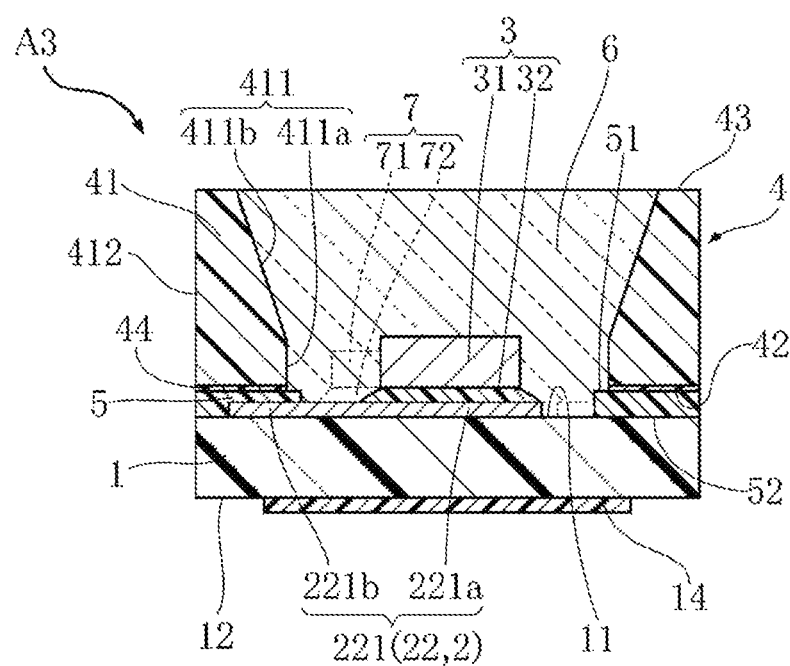
FIG. 18 is a sectional view taken along line XVIII-XVIII in FIG. 16.

An LED package A3 according to a third embodiment of the present disclosure will be described with reference to FIGS. 16, 17 and 18. FIG. 16 is a main part plan view showing the LED package A3. FIG. 17 is a sectional view taken along line XVII-XVII in FIG. 16. FIG. 18 is a sectional view taken along line XVIII-XVIII in FIG. 16. In addition, for the purpose of easy understandings, FIG. 16 does not show the junction layer 32 of the LED chip 3, the sealing resin 6 and a junction layer 72 of a protection element 7 to be described later. In addition, for the purpose of easy understandings, FIGS. 17 and 18 do not show the bonding wire 23 of the metal wirings 2. In this embodiment, the LED package A3 has a rectangular shape when viewed from above.

The LED package A3 of this embodiment is different from the earlier-described LED packages A1 and A2 in terms of the arrangement of the conductive part 22 and bonding wire 23 of the metal wirings 2 and the configuration of the LED chip 3 and the covering member 5. The LED package A3 further includes the protection element 7.

The conductive part 22 of the metal wirings 2 consists of a first conductive part 221 and a second conductive part 222 which are spaced apart from each other. The first conductive part 221 includes a die pad 221a, a strip portion 221b, an additional die pad 221c and a corner portion 221d. The die pad 221a is a rectangular portion, when viewed from above, on which the LED chip 3 is loaded. In this embodiment, the die pad 221a is electrically isolated from the chip body 31 of the LED chip 3. The strip portion 221b interconnects the die pad 221a, the additional die pad 221c and the corner portion 221d, and is a portion extending in the direction X shown in FIG. 16. The strip portion 221b is connected to the die pad 221a and the additional die pad 221c through portions extending from the strip portion 221b in a direction perpendicular to the direction X. The additional die pad 221c is a rectangular portion, when viewed from above, on which the protection element 7 is loaded. In this embodiment, the additional die pad 221c is electrical conduction with an element body 71 of the protection element 7 to be described later. The corner portion 221d is a rectangular portion when viewed from above and is located in the upper left side of the substrate 1 shown in FIG. 16. The corner portion 221d is connected to the strip portion 221b and the upper surface electrode 211 of the one electrode 21 (the electrode 21 in the left side shown in FIG. 16). The one electrode 21 is in electrical conduction with the element body 71 of the protection element 7 by the strip portion 221b and the corner portion 221d. Further, in this embodiment, as shown in FIG. 16, a portion of each of the strip portion 221b and the corner portion 221d is interposed between the loading surface 11 of the substrate 1 and the supporting surface 42 of the housing 4.

The second conductive part 222 includes a wire bonding pad 222a. The wire bonding pad 222a is a rectangular portion when viewed from above and is located in the lower right side of the substrate 1 shown in FIG. 16. The wire bonding pad 222a is connected to the upper surface electrode 211 of the other electrode 21 (the electrode 21 in the right side shown in FIG. 16). Further, in this embodiment, as shown in FIG. 16, a portion of the wire bonding pad 222a is interposed between the loading surface 11 of the substrate 1 and the supporting surface 42 of the housing 4.

The bonding wire 23 of the metal wirings 2 consists of a first bonding wire 231, a second bonding wire 232 and a third bonding wire 233. The first bonding wire 231 is a wire interconnecting the chip body 31 of the LED chip 3 and the corner portion 221d of the first conductive part 221. The one electrode 21 is in electrical conduction with the chip body 31 of the LED chip 3 by the first bonding wire 231. The second bonding wire 232 is a wire interconnecting the chip body 31 of the LED chip 3 and the wire bonding pad 222a of the second conductive part 222. The other electrode 21 is in electrical conduction with the chip body 31 of the LED chip 3 by the second bonding wire 232. The third bonding wire 233 is a wire interconnecting the element body 71 of the protection element 7 and the wire bonding pad 222a. The other electrode 21 is in electrical conduction with the element body 71 of the protection element 7 by the third bonding wire 233.

The LED chip 3 is a light source of the LED package A3. The LED chip 3 includes the chip body 31 and the junction layer 32. In this embodiment, a p side electrode (anode) (not shown) and an n side electrode (cathode) (not shown) are formed on the upper surface of the chip body 31 shown in FIG. 17. As the first bonding wire 231 of the metal wirings 2 is connected to the n side electrode, the chip body 31 is in electrical conduction with the corner portion 221d of the first conductive part 221 through the first bonding wire 231. In addition, as the second bonding wire 232 of the metal wirings 2 is connected to the p side electrode, the chip body 31 is in electrical conduction with the wire bonding pad 222a of the second conductive part 222 through the second bonding wire 232. In this embodiment, the junction layer 32 is an electrical insulator. In this case, the junction layer 32 is made of, for example, synthetic resin consisting mainly of polyimide resin.

The covering member 5 is a member disposed on the loading surface 11 of the substrate 1. In this embodiment, as shown in FIG. 16, among the metal wirings 2, the upper surface electrode 211 of the pair of electrodes 21, a portion of the side surface electrode 213 of the pair of electrodes 21, and a portion of each of the strip portion 221b, the corner portion 221d and the wire bonding pad 222a of the conductive part 22 are covered with the covering member 5. The opening portion 54 of the covering member 5 is a portion containing the LED chip 3 when viewed from above. In this embodiment, the opening portion 54 contains the protection element 7 in addition to the LED chip 3. Therefore, the area of the opening portion 54 is larger than those in the LED packages A1 and A2.

The protection element 7 includes the element body 71 and the junction layer 72. The element body 71 is a pn junction semiconductor element acting to protect the chip body 31 of the LED chip 3 from electrostatic discharge and overvoltage. The element body 71 is, for example, a Zener diode (constant voltage diode). If a reverse voltage is applied to the element body 71, a rapid current is flown into the element body 71 when the reverse voltage reaches a certain value. The element body 71 has the property that a voltage applied to the element body 71 is substantially constant even when the current is changed in magnitude. In this embodiment, an n side electrode (cathode) (not shown) is formed on the upper surface of the element body 71 shown in FIG. 17 and a p side electrode (anode) (not shown) is formed on the lower surface of the element body 71 shown in FIG. 17. As the third bonding wire 233 of the metal wirings 2 is connected to the n side electrode, the element body 71 is in electrical conduction with the wire bonding pad 222a of the second conductive part 222 through the third bonding wire 233. In addition, the p side electrode is in electrical conduction with the additional die pad 221c of the first conductive part 221 through the junction layer 72.

The junction layer 72 is a portion interposed between the protection element 7 and the additional die pad 221c of the first conductive part 221. The junction layer 72 acts to fix the element body 71 to the additional die pad 221c. In this embodiment, the junction layer 72 is an electrical conductor. In this case, the junction layer 72 is made of, for example, Ag paste.

According to this embodiment, it is possible to secure a longer distance from the center of the LED chip 3 to the inner peripheral surface 411 of the housing 4 while securing the adhesion area of the housing 4 to the substrate 1. Therefore, it is possible to achieve higher brightness of the LED package A3 while securing an adhesion force between the substrate 1 and the housing 4.

The protection element 7 can protect the chip body 31 of the LED chip 3 from electrostatic discharge and overvoltage. The metal wirings 2 interconnect the chip body 31 and the element body 71 of the protection element 7 in parallel. For example, even if backward static electricity is discharged to the LED package A3, this static electricity is flown into the element body 71 but cannot be flown into the chip body 31. In addition, when a forward voltage is applied to the LED package A3, a voltage applied to the chip body 31 is kept equal to or lower than a certain value, as described above. In addition, even if forward static electricity is discharged to the LED package A3, a voltage applied to the chip body 31 is always kept equal to or lower than a certain value. Therefore, even if the forward and backward static electricity is discharged to the LED package A3, it is possible to prevent the chip body 31 from malfunctioning due to the static electricity. In addition, it is possible to prevent a forward overvoltage from being applied to the chip body 31.

The LED package according to the present disclosure is not limited to the above-described embodiments. Details of various parts of the LED package according to the present disclosure can be modified in different ways.

According to the present disclosure in some embodiments, the LED package is disposed on the loading surface of the substrate and includes the covering member, which has the closing portion overlapping at least a portion of the concave portion of the substrate when viewed from above. In addition, at least a portion of the supporting surface of the housing is fixed to the closing portion. With this configuration, the closing portion can be effectively utilized as an adhesion surface of the housing to the substrate. As a result, it is possible to secure a longer distance from the center of the LED chip to the inner peripheral surface of the housing while securing the adhesion area of the housing to the substrate. Securing the longer distance facilitates increased expansion of a range of the secondary light source of the LED package, which is formed by the housing. Therefore, it is possible to achieve higher brightness of the LED package while securing an adhesion force between the substrate and the housing.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A light emitting device (LED) package comprising:
    a substrate having a loading surface, a mounting surface and two concave portions, each of the two concave portions being formed at a side of the substrate, wherein the loading surface and the mounting surface face opposite directions and the two concave portions have inner surfaces, respectively, each of the inner surfaces intersecting both the loading surface and the mounting surface;
    metal wirings including two electrodes, a bonding wire, and a conductive part, the two electrodes being configured to cover a portion of the loading surface, a portion of the mounting surface and the inner surfaces of the two concave portions, and the conductive part being disposed on the loading surface and including a bonding pad;
    a light emitting device (LED) chip loaded on the conductive part of the metal wirings and interconnected with the bonding pad by the bonding wire;
    a housing having a side wall surrounding the LED chip and a supporting surface facing the loading surface of the substrate; and a covering member which is disposed on the loading surface of the substrate and has a closing portion overlapping at least a portion of each of the two concave portions when viewed from above, wherein side portions of the two electrodes cover the inner surfaces of the two concave portions, respectively, and a partial surface of the closing portion, which extends in a direction perpendicular to the mounting surface, makes surface contact with the side portions when viewed in a direction parallel with the mounting surface, wherein at least a portion of the supporting surface of the housing is fixed to the closing portion, wherein the covering member has an upper surface facing the supporting surface of the housing, wherein an entire area of the upper surface of the covering member is larger than an entire area of the supporting surface of the housing, wherein an opening portion in the covering member includes the LED chip, the bonding wire, and a portion of the bonding pad, wherein, between a first connection point of the bonding wire and the LED chip and a second connection point of the bonding wire and the bonding pad, a first dimension of the opening portion that extends over a first point of the bonding wire in a direction orthogonal to an extending direction of the bonding wire when viewed from above is greater than or equal to a second dimension of the opening portion that extends over a second point of the bonding wire in the direction orthogonal to the extending direction of the bonding wire when viewed from above, the first point being closer to the first connection point than the second point, and wherein a dimension of the opening portion that extends over the first connection point in the direction orthogonal to the extending direction of the bonding wire when viewed from above is largest among dimensions of the opening portion that extend over the bonding wire in the direction orthogonal to the extending direction of the bonding wire when viewed from above, ranging from the dimension that extends over the first connection point to a dimension that extends over the second connection point.

2. The LED package of claim 1, further comprising an adhesive layer interposed between the covering member and the supporting surface of the housing.

3. The LED package of claim 2, wherein the covering member is made of a first material, the metal wirings are made of a second material, and the housing is made of a third material, and wherein the first material allows a first adhesion strength between the first material and the second material and a second adhesion strength between the first material and the third material to be larger than a third adhesion strength between the second material and the third material.

4. The LED package of claim 3, wherein the covering member is a film made of synthetic film.

5. The LED package of claim 4, wherein the covering member is white.

6. The LED package of claim 1, wherein at least one of the metal wirings is partially covered with the covering member.

7. The LED package of claim 6, wherein the metal wirings have a portion interposed between the loading surface of the substrate and the supporting surface of the housing.

8. The LED package of claim 1, wherein the conductive part of the metal wirings includes a first conductive part and a second conductive part which are spaced from each other, the first conductive part being in electrical conduction with one of the two electrodes, and the second conductive part being in electrical conduction with the other of the two electrodes.

9. The LED package of claim 8, wherein the first conductive part includes a die pad on which the LED chip is loaded.

10. The LED package of claim 9, further comprising a junction layer interposed between the LED chip and the die pad of the first conductive part.

11. The LED package of claim 10, wherein the junction layer is an electrical conductor.

12. The LED package of claim 10, wherein the junction layer is an electrical insulator.

13. The LED package of claim 1, wherein the side wall of the housing has an inner peripheral surface facing the LED chip, the inner peripheral surface forms a shape, and
when viewed from above, a first area of the shape at a first distance from the substrate in a thickness direction of the substrate is larger than a second area of the shape at a second distance that is smaller than the first distance from the substrate.

14. The LED package of claim 13, wherein an outer edge shape formed by the inner peripheral surface of the housing when viewed from above is rectangular.

15. The LED package of claim 13, wherein an outer edge shape formed by the inner peripheral surface of the housing when viewed from above is circular.

16. The LED package of claim 1, further comprising a sealing resin which covers the LED chip and is filled in a region surrounded by the side wall of the housing.

17. The LED package of claim 16, wherein the sealing resin is formed of a transparent synthetic resin containing fluorescent substances.

18. The LED package of claim 1, wherein each of the two electrodes includes an Au plating layer.

19. The LED package of claim 1, further comprising an insulating film which is an electrical insulator formed on the mounting surface of the substrate and is located in a region sandwiched between the two electrodes on the mounting surface.

20. The LED package of claim 1, further comprising a protection element loaded on the conductive part of the metal wirings.

21. The LED package of claim 20, wherein the conductive part of the metal wirings includes a die pad on which the LED chip is loaded, and an additional die pad on which the protection element is loaded.

22. The LED package of claim 20, wherein the protection element is a Zener diode.

23. A package comprising:
a substrate having a front surface, a rear surface, and a side wall that extends from the front surface to the rear surface;
a first concave portion and a second concave portion which are provided in the side wall of the substrate;
a first electrode and a second electrode which extend from the front surface of the substrate to the rear surface of the substrate via the first concave portion and the second concave portion, respectively;
an electronic device disposed on a portion of the first electrode, the portion of the first electrode being formed on the front surface of the substrate;

a wire interconnecting the electronic device and the second electrode;

a first insulating layer formed to extend from the front surface of the substrate to the first concave portion; and an insulator which is formed on the first insulating layer and the front surface of the substrate and includes a side wall of a frame shape when viewed from above, the side wall of the insulator being disposed along an outer edge of the substrate to expose the electronic device and configured to reflect a light emitted from the electronic device, wherein the insulator has a supporting surface facing the first insulating layer and the front surface of the substrate, the first insulating layer having an upper surface facing the supporting surface of the insulator, wherein an entire area of the upper surface of the first insulating layer is larger than an entire area of the supporting surface of the insulator, wherein an opening portion in the first insulating layer includes the electronic device, the wire, and a portion of the second electrode, wherein, between a first connection point of the wire and the electronic device and a second connection point of the wire and the second electrode, a first dimension of the opening portion that extends over a first point of the wire in a direction orthogonal to an extending direction of the wire when viewed from above is greater than or equal to a second dimension of the opening portion that extends over a second point of the wire in the direction orthogonal to the extending direction of the wire when viewed from above, the first point being closer to the first connection point than the second point, and wherein a dimension of the opening portion that extends over the first connection point in the direction orthogonal to the extending direction of the wire when viewed from above is largest among dimensions of the opening portion that extend over the wire in the direction orthogonal to the extending direction of the wire when viewed from above, ranging from the dimension that extends over the first connection point to a dimension that extends over the second connection point.

24. The package of claim 23, wherein the side wall of the substrate includes a first side wall, a second side wall, a third side wall, and a fourth side wall, wherein the first concave portion is formed in the first side wall, wherein the second concave portion is formed in the third side wall positioned at an opposite side of the first side wall with respect to the substrate, wherein the package further comprises:

a second insulating layer formed to extend from the front surface of the substrate to the second concave portion, and wherein the insulator is formed on the second insulating layer and the front surface of the substrate.

25. The package of claim 24, wherein the first side wall and an outer peripheral surface of the side wall of the insulator are flush with each other.

26. The package of claim 24, wherein the insulator is spaced apart from the electronic device.

27. The package of claim 24, wherein the insulator adheres to the first insulating layer and the front surface of the substrate by an adhesive layer.

28. The package of claim 24, wherein the first insulating layer covers the first concave portion as viewed in a first direction perpendicular to the front surface of the substrate.

29. The package of claim 28, wherein the second insulating layer covers the second concave portion as viewed in the first direction perpendicular to the front surface of the substrate.

30. The package of claim 24, wherein the first insulating layer covers the first concave portion as viewed in a first direction perpendicular to the front surface of the substrate, and wherein the second insulating layer covers the second concave portion as viewed in the first direction perpendicular to the front surface of the substrate.

31. The package of claim 28, wherein a first end portion of the first insulating layer is positioned on the front surface of the substrate and a second end portion of the first insulating layer is positioned on the first concave portion.

32. The package of claim 29, wherein a first end portion of the second insulating layer is positioned on the front surface of the substrate and a second end portion of the second insulating layer is positioned on the second concave portion.

33. The package of claim 30, wherein a first end portion of the first insulating layer is positioned on the front surface of the substrate and a second end portion of the first insulating layer is positioned on the first concave portion, and wherein a first end portion of the second insulating layer is positioned on the front surface of the substrate and a second end portion of the second insulating layer is positioned on the second concave portion.

34. The LED package of claim 1, wherein the housing has an opening portion shaped by the side wall, and wherein the covering member has a protruding portion that is positioned within the opening portion of the housing when viewed from above, the protruding portion being covered by a sealing resin that covers the LED chip and is filled in a region surrounded by the side wall of the housing.

35. The LED package of claim 34, wherein a size of the opening portion of the covering member is smaller than a size of the opening portion of the housing when viewed from above.

36. The LED package of claim 1, wherein the covering member at least partially overlaps the two electrodes and the conductive part when viewed from above.

37. The LED package of claim 1, wherein a size of the opening portion of the covering member is smaller than a size of an opening portion shaped by the first inner peripheral surface when viewed from above.

38. The LED package of claim 1, wherein the closing portion is thicker than a portion of the covering member excluding the closing portion, and wherein a front surface of the closing portion is flush with a front surface of the portion of the covering member excluding the closing portion.

39. The LED package of claim 1, wherein the covering member has a protruding portion which protrudes inward from an inner peripheral surface of the side wall of the housing, and the protruding portion is covered by a sealing resin which covers the LED chip and is filled in a region surrounded by the side wall of the housing.

40. The package of claim 23, wherein the first insulating layer has a protruding portion which protrudes inward from an inner peripheral surface of the side wall of the insulator, and the protruding portion is covered by a sealing resin which covers the LED chip and is filled in a region surrounded by the side wall of the insulator.

41. The LED package of claim 39, wherein an upper surface of the protruding portion is in contact with the sealing resin.

42. The package of claim 40, wherein an upper surface of the protruding portion is in contact with the sealing resin.

43. The LED package of claim 34, wherein a shape of the covering member is different from a shape of the housing, when viewed from above.

44. The LED package of claim 43, wherein the opening portion of the covering member is in a shape including a circular shape containing the LED chip, a semi-circular shape containing a portion of the bonding pad, and a rectangular shape sandwiched between the circular shape and the semi-circular shape, and wherein the circular shape, the semi-circular shape, and the rectangular shape overlap with each other, when viewed from above.

45. The package of claim 23, wherein a shape of the first insulating layer is different from a shape of the insulator when viewed from above.

46. The package of claim 45, wherein the insulator includes an opening portion shaped by the side wall, the opening portion of the insulator being a circular shape when viewed from above.

47. The package of claim 45, wherein the opening portion of the first insulating layer is in a shape including a circular shape containing the electronic device, a semi-circular shape containing the portion of the second electrode, and a rectangular shape sandwiched between the circular shape and the semi-circular shape, and wherein the circular shape, the semi-circular shape, and the rectangular shape overlap with each other, when viewed from above.

* * * * *